US008836676B2

(12) United States Patent  
Cho

(10) Patent No.: US 8,836,676 B2  
(45) Date of Patent: Sep. 16, 2014

(54) SENSING CIRCUIT AND DISPLAY APPARATUS INCLUDING THE SAME

(75) Inventor: Jaehyun Cho, Seoul (KR)

(73) Assignee: Samsung Display Co., Ltd. (KR)

( * ) Notice: Subject to any disclaimer, the term of this patent is extended or adjusted under 35 U.S.C. 154(b) by 1114 days.

(21) Appl. No.: 12/825,854

(22) Filed: Jun. 29, 2010

(65) Prior Publication Data

US 2011/0032443 A1 Feb. 10, 2011

(30) Foreign Application Priority Data

Aug. 10, 2009 (KR) .................. 10-2009-0073487

(51) Int. Cl.
 *G06F 3/00* (2006.01)
 *G09G 5/00* (2006.01)
(52) U.S. Cl.
 USPC ......................................... 345/204
(58) Field of Classification Search
 USPC ................................. 345/104, 207
 See application file for complete search history.

(56) References Cited

U.S. PATENT DOCUMENTS

| 6,803,958 | B1* | 10/2004 | Wang | 348/308 |
|---|---|---|---|---|
| 6,917,027 | B2* | 7/2005 | Krymski | 250/208.1 |
| 7,274,009 | B2 | 9/2007 | Huang et al. | |
| 2005/0184952 | A1* | 8/2005 | Konno et al. | 345/102 |
| 2008/0186265 | A1* | 8/2008 | Lee | 345/82 |
| 2009/0231313 | A1* | 9/2009 | Teranishi et al. | 345/207 |
| 2010/0053490 | A1* | 3/2010 | Kang et al. | 349/48 |

FOREIGN PATENT DOCUMENTS

| JP | 2003087663 | 3/2003 |
|---|---|---|
| JP | 2004015298 | 1/2004 |
| KR | 1020070111857 | 11/2007 |

* cited by examiner

*Primary Examiner* — Kent Chang  
*Assistant Examiner* — Nathan Brittingham  
(74) *Attorney, Agent, or Firm* — Cantor Colburn LLP

(57) ABSTRACT

A sensing circuit includes a sensor array, a first controller and a second controller. The sensor array is charged by a sensing signal corresponding to an external light in response to a driving signal during a first time period and discharged in response to a switching signal during a second time period. The first controller provides the driving signal to the sensor array. The second controller provides the switching signal to the sensor array.

14 Claims, 6 Drawing Sheets

SENSING CIRCUIT AND DISPLAY APPARATUS INCLUDING THE SAME

This application claims priority to Korean Patent Application No. 10-2009-0073487, filed on Aug. 10, 2009, and all the benefits accruing therefrom under 35 U.S.C. §119, the content of which is in its entirety is herein incorporated by reference.

BACKGROUND OF THE INVENTION (1) Field of the Invention

The present invention relates to a sensing circuit and a display apparatus including the sensing circuit. More particularly, the present invention relates to a sensing circuit which effectively detects a light, and a display apparatus including the sensing circuit.

(2) Description of the Related Art

A display apparatus typically includes an image sensor, which senses image information provided from an external source. The image sensor converts a received light intensity into one or more converted electric signals, and outputs the converted electric signals. The image sensor typically includes image sensing pixels that convert the received light intensity into the converted electric signals.

The image sensing pixels may be disposed in a matrix pattern and output the converted electric signals in a predetermined order. The electric signals outputted from the image sensing pixels in the predetermined order are displayed as images corresponding to the received light intensity.

BRIEF SUMMARY OF THE INVENTION

An exemplary embodiment of the present invention relates to a sensing circuit which substantially effectively detects a light.

Another exemplary embodiment of the present invention relates to a display apparatus including the sensing circuit.

In an exemplary embodiment, the sensing circuit includes a sensor array, a first controller and a second controller. The sensor array is charged by a sensing signal corresponding to an external light in response to a driving signal during a first time period and discharged in response to a switching signal during a second time period. The first controller provides the driving signal to the sensor array. The second controller provides the switching signal to the sensor array.

The sensing circuit may further includes a third controller which provides a control signal to the sensor array corresponding to the first time period and the second time period and controls charging of the sensor array with the sensing signal.

The sensor array may include sensors disposed in a matrix.

In an exemplary embodiment, each of the sensors may include a light receiving part, a charging part, a switching part, and a charging control part. The light receiving part outputs the sensing signal corresponding to the external light in response to the driving signal received during a frame time period which includes the first time period and the second time period, and the charging part is connected to the light receiving part and charges the sensing signal during the first time period of the frame time period. The switching part is connected to the charging part and reads out the sensing signal charged at the charging part during the second time period of the frame time period, and the charging control part connects the light receiving part to the charging part and controls charging of the charging part, where the charging control part is turned on during the first time period and turned off during the second time period.

The sensing circuit may further includes a first signal line connected to the first controller and which provides the driving signal to the light receiving part, a switching line connected to the second controller and which provide the switching signal to the switching part, and a second signal line connected to the third controller and which provides the control signal to the charging control part.

The light receiving part may include at least one of a photo-thin film transistor and a PIN diode.

The driving signal provided to the light receiving part from the first controller may be a direct-current voltage.

In another exemplary embodiment, a display apparatus includes a display panel which receives a light and displays an image, and a sensing circuit which detects an external light from an external source and provides a sensing signal corresponding to the external light to the display panel. The sensing circuit includes a sensor array, a first controller and a second controller. The sensor array is charged by the sensing signal in response to a driving signal during a first time period and discharged in response to a switching signal during a second time period. The first controller provides the driving signal to the sensor array. The second controller provides the switching signal to the sensor array.

In an exemplary embodiment, when the charging control part controls the charging time of the charging part, the sensors disposed in a matrix are simultaneously charged by sensing signals corresponding to an external light during a predetermined time period and output the charged sensing signals in a predetermined order, e.g., successively, and the sensing circuit thereby senses the image substantially accurately, e.g., without distortion.

In an exemplary embodiment, the display apparatus may display an image based on the sensing signal sensed from the sensing circuit on the display panel.

BRIEF DESCRIPTION OF THE DRAWINGS

The above and other aspects of the present invention will become more apparent by describing in further detail exemplary embodiments thereof with reference to the accompanying drawings, in which.

DETAILED DESCRIPTION OF THE INVENTION

Figure 1:
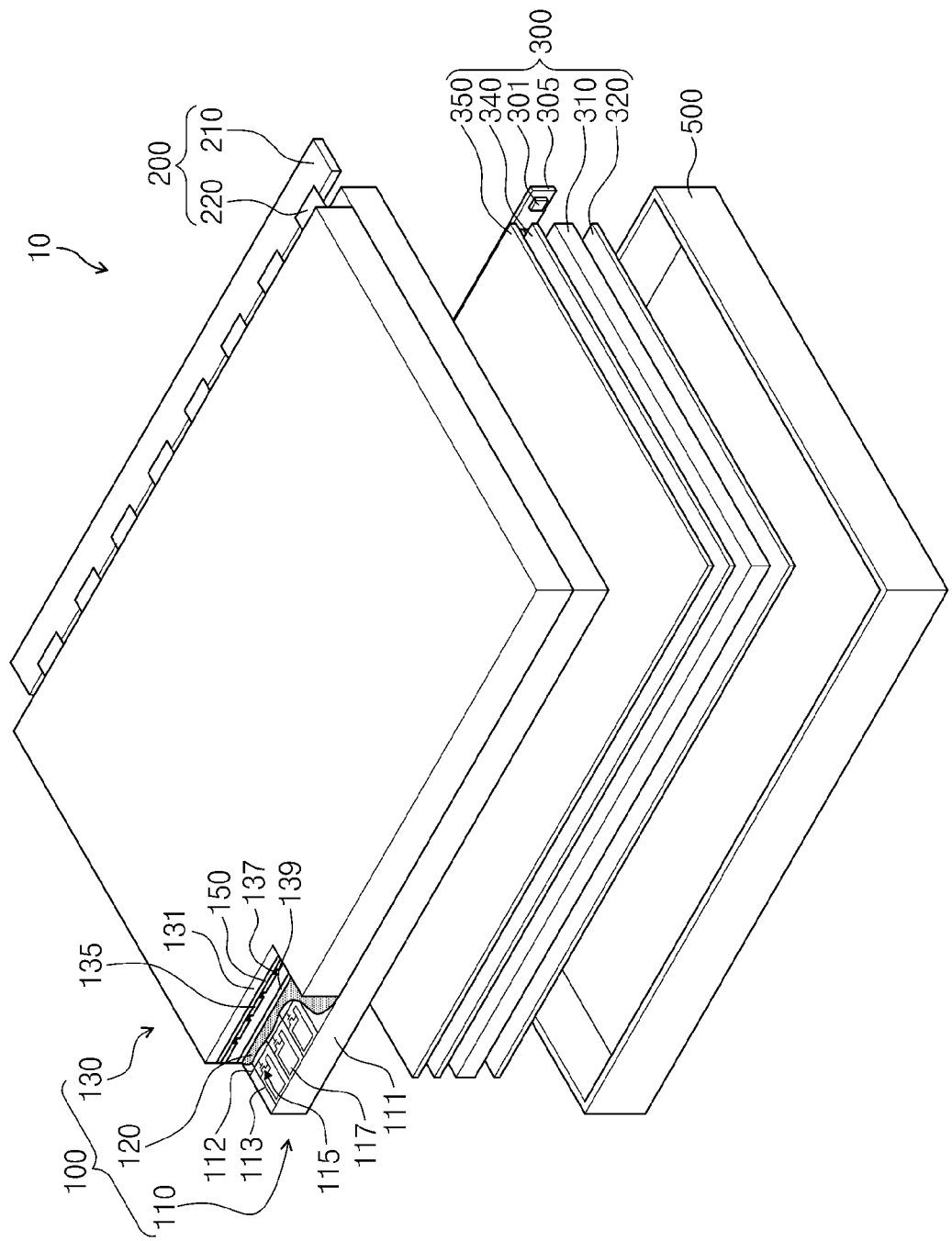
FIG. 1 is an exploded perspective view illustrating an exemplary embodiment of a display apparatus according to the present invention.

The invention is described more fully hereinafter with reference to the accompanying drawings, in which various embodiments are shown. This invention may, however, be embodied in many different forms, and should not be construed as limited to the embodiments set forth herein. Rather, these embodiments are provided so that disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is an exploded perspective view illustrating an exemplary embodiment of a display apparatus according to the present invention.

As shown in FIG. 1, a display apparatus 10 includes a display panel 100 which receives a light to display an image, a driving circuit 200 which provides a driving signal to the display panel 100, a backlight unit 300 which provide the light to the display panel 100, and a chassis 500 which the display panel 100 and the backlight unit 300 are disposed in.

The display panel 100 includes a first substrate 110, a second substrate 130 disposed opposite, e.g., facing, the first substrate 110, and a liquid crystal layer 120 interposed between the first substrate 110 and the second substrate 130 and which controls an amount of light transmission to display an image.

The first substrate 110 includes a first base substrate 111 including glass or plastic. The first substrate 110 includes gate lines 112 extending in a first direction and disposed apart from one another along a second direction substantially perpendicular to the first direction on the first base substrate 111, data lines 113 extending in the second direction, thin film transistors 115 connected to the gate lines 112 and the data lines 113, and pixel electrodes 117 connected to the thin film transistors 115.

The second substrate 130 includes a second base substrate 131 including glass or plastic. The second substrate 130 includes color filters 135 disposed in a predetermined pattern corresponding to the pixel electrodes 117 on the second base substrate 131 and a sensing circuit 150 disposed between the color filters 135 and the second base substrate 131. In an exemplary embodiment, the second substrate 130 includes a black matrix 137 disposed between adjacent color filters of the color filters 135, and a common electrode 139 which generates an electric field with the pixel electrodes 117. The sensing circuit 150 receives an external light from an external source and provides a sensing signal corresponding to the external light to the display panel 100. Thus, the display panel 100 may display an image based on the sensing signal. In an exemplary embodiment, the sensing circuit 150 may be disposed between the second base substrate 131 and the color filters 135, but it should not be limited thereto or thereby. In another exemplary embodiment, the sensing circuit 150 may be disposed on the first base substrate 111. Details of the sensing circuit 150 will be described in greater detail below with reference to FIG. 2.

The driving circuit 200 includes a gate driver (not shown), a data driver (not shown), a controller (not shown), and a circuit board 210 and applies various driving signals to the display panel 100. The gate driver, the data driver and the controller are disposed on the circuit board 210 and the circuit board 210 is connected to the first substrate 110 through signal transfer films 220.

In another exemplary embodiment, the gate driver may be disposed on the signal transfer films 220 or the first substrate 110. In still another exemplary embodiment, the gate driver may be disposed on the signal transfer film 220 or the first substrate 110 as a type of chip. In an exemplary embodiment, the data driver may be disposed on the signal transfer films 220 or the first substrate 110 as a type of chip.

The backlight unit 300 may include a light source 301, a light guide plate 310, a reflection sheet 320, a diffusion sheet 340 and a prism sheet 350 and supply the light to the display panel 100.

The light source 301 is disposed on a light source substrate 305 and disposed adjacent to a side of or below the display panel 100. The light source 301 receives a driving voltage to generate the light. The light source substrate 305 provides the light source 301 with the driving voltage supplied from an external source and emits heat generated by the light source 301.

The light guide plate 310 includes a transparent material to guide the light. The light guide plate 310 receives the light emitted from the light source 301 through an incident surface thereof adjacent to the light source 301 and changes a direction of the incident light traveling. The light guide plate 310 guides the incident light traveling and thereby transmits the light to the display panel 100.

The reflection sheet 320 includes a base sheet and a light reflection layer disposed on the base sheet and is disposed below the light guide plate 310. The reflection sheet 320 reflects the light leaked through a lower surface of the light guide plate 310 to reduce loss of the light while the light is guided by the light guide plate 310.

The diffusion sheet 340 is disposed on the light guide plate 310 and receives the light emitted from the light guide plate 310. The diffusion sheet 340 diffuses the received light, and thereby substantially uniformly provides the light to the display panel 100.

The prism sheet 350 is disposed on the diffusion sheet 340 and receives the light emitted from the diffusion sheet 340. The prism sheet 350 condenses and outputs the received light such that the light is substantially vertically incident to the display panel 100. In an embodiment, the diffusion sheet 340 and the prism sheet 350 may include one or more sheets.

The chassis 500 receives the display panel 100 and the backlight unit 300 therein and protects the display panel 100 and the backlight unit from external impacts.

Figure 2:
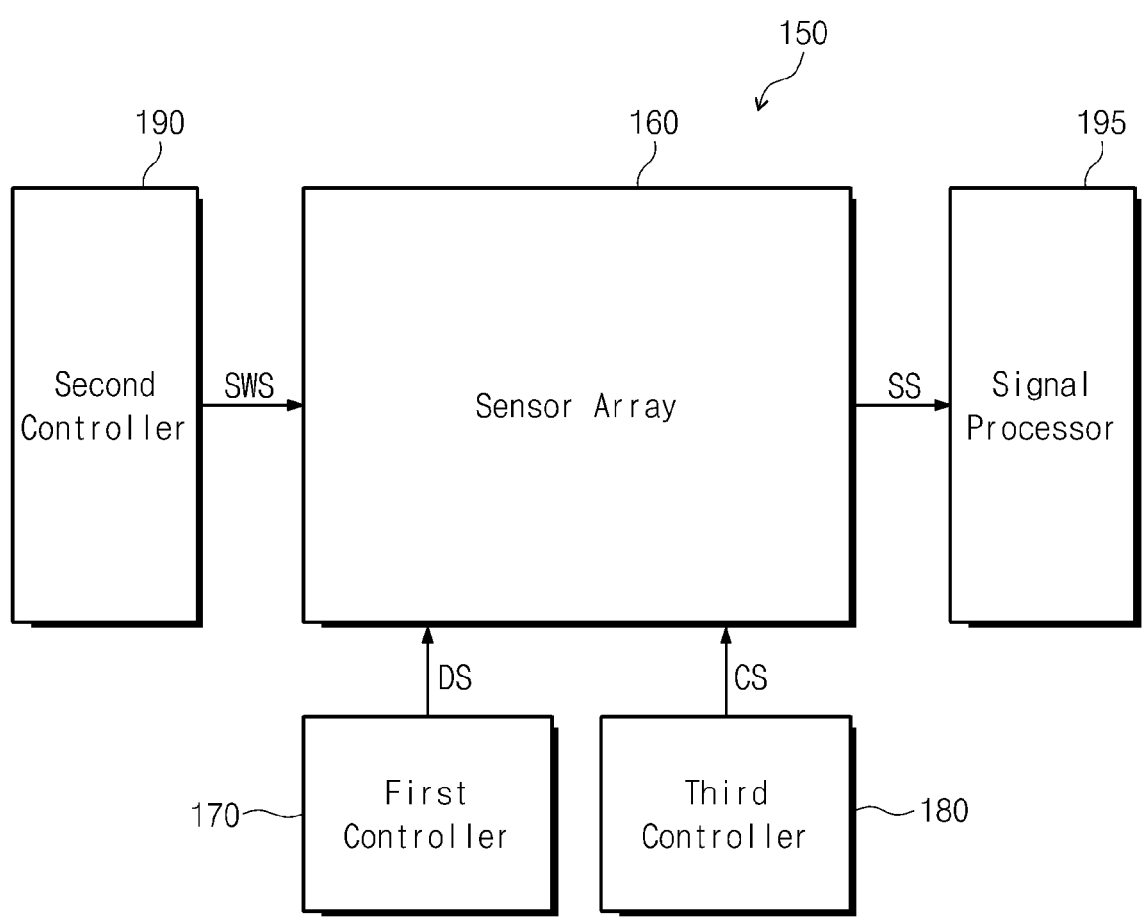
FIG. 2 is a block diagram illustrating an exemplary embodiment of a sensing circuit of the display apparatus of FIG. 1.

FIG. 2 is a block diagram illustrating an exemplary embodiment of the sensing circuit 150 of FIG. 1.

As shown in FIG. 2, the sensing circuit 150 includes a sensor array 160 that senses the external light from an external source to output a sensing signal SS corresponding to the external light, a first controller 170 which provides a driving signal DS to the sensor array 160 during a first time period of a frame time period, a third controller 180 that provides a control signal CS to the sensor array 160 during a second time period of the frame time period, a second controller 190 that provides a switching signal SWS to the sensor array 160 during the second time period, and a signal processor 195 that receives the sensing signal SS and converts the sensing signal SS to a data signal. The sensing circuit 150 senses the external light and outputs the sensing signal SS during the frame time period, and processes the sensing signal SS. In an exemplary embodiment, the sensing circuit 150 is charged by the sensing signal SS during the first time period and discharged during the second time period.

The sensor array 160 will be described hereinafter in further detail with reference to FIG. 3.

Figure 3:
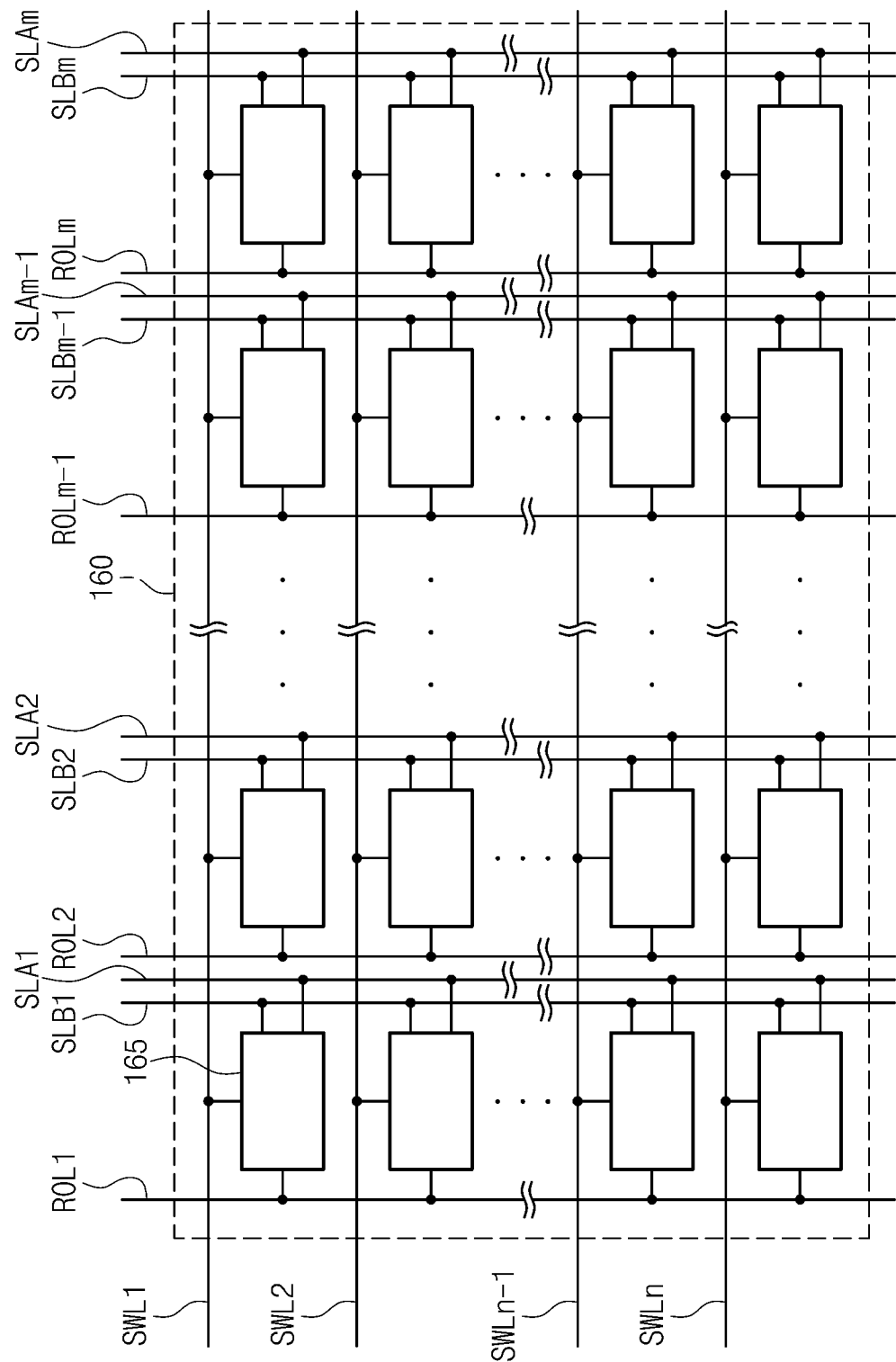
FIG. 3 is a plan view illustrating an exemplary embodiment of a sensor array of the sensing circuit of FIG. 2.

FIG. 3 is a plan view illustrating an exemplary embodiment of the sensor array 160 of FIG. 2.

As shown in FIG. 3, the sensor array 160 includes switching lines, e.g., a first row switching line SWL1 to an n-th row switching line SWLn, read-out lines, e.g., a first column read-out line ROL1 to an m-th column read-out line ROLm, sensors 165, first signal lines, e.g., a first column first signal line SLA1 to an m-th column first signal line SLAm, and second signal lines, e.g., a first column second signal line SLB1 to an m-th column second signal line SLBm.

The switching lines, e.g., the first row switching line SWL1 to the n-th row switching line SWLn, extend along a first direction and are alternately disposed along a second direction substantially perpendicular to the first direction. The switching lines, e.g., the first row switching line SWL1 to the n-th row switching line SWLn, connect the sensors 165 to the second controller 190, and thereby provide the switching signal SWS to the sensors 165. The read-out lines, e.g., the first column read-out line ROL1 to the m-th column read-out line ROLm, extend in the second direction and are disposed along the first direction. The read-out lines, e.g., the first column read-out line ROL1 to the m-th column read-out line ROLm, connect the sensors 165 to the signal processor 195, and thereby provide the sensing signal SS read out from the sensors 165 to the signal processor 195.

The sensors 165 are disposed in a matrix form. Each of the sensors 165 is connected to a corresponding switching line of the switching lines, e.g., one of the first row switching signal SWL1 to the n-th row switching signal SWLn and a corresponding read-out line of the read-out lines, e.g., one of the first column read-out line ROL1 to the m-th column read out line ROLm. The each of the sensors 165 generates a sensing signal SS in response to the external light and output the sensing signal SS to the corresponding read-out line of the read-out lines in response to a switching signal SWS received through the corresponding switching line.

The first signal lines, e.g., the first column first signal line SLA1 to the m-th column first signal line SLAm, extend along the second direction and are alternately disposed along the first direction. The first signal lines, e.g., the first column first signal line SLA1 to the m-th column first signal line SLAm, connect the sensors 165 to the first controller 170 and thereby provide the driving signal DS to the sensors 165. The first signal lines, e.g., the first column first signal line SLA1 to the m-th column first signal line SLAm, provide a direct-current ("DC") voltage output from the first controller 170 as the driving signal DS to the sensors 165. In an exemplary embodiment, the DC voltage may be about −13 volts (V).

The second signal lines, e.g., the first column second signal line SLB1 to the m-th column second signal line SLBm, extend along the second direction and are alternately disposed along the first direction adjacent to the first signal lines e.g., the first column first signal line SLA1 to the m-th column first signal line SLAm, respectively. The second signal lines, e.g., the first column second signal line SLB1 to the m-th column second signal line SLBm, connect the sensors 165 to the third controller 180 and thereby provide the control signal CS to the sensors 165.

The first controller 170 provides the driving signal DS to the sensors 165 through the first signal lines e.g., the first column first signal line SLA1 to the m-th column first signal line SLAm, and the third controller 180 provides the control signal CS to the sensors 165 through the second signal lines, e.g., the first column second signal line SLB1 to the m-th column second signal line SLBm. The second controller 190 provides the switching signal SWS to the sensors 165 through the switching lines, e.g., the first row switching line SWL1 to the n-th row switching line SWLn.

Hereinafter, an exemplary embodiment of a sensor of the sensor array which receives the driving signal DS, the control signal CS, and the switching signal SWS will be described in further detail with reference to FIGS. 4 and 5, and the same or like elements shown in FIG. 3 have been labeled with the same reference characters as used above to describe the exemplary embodiments of the sensor shown in FIGS. 4 and 5.

Figure 4:
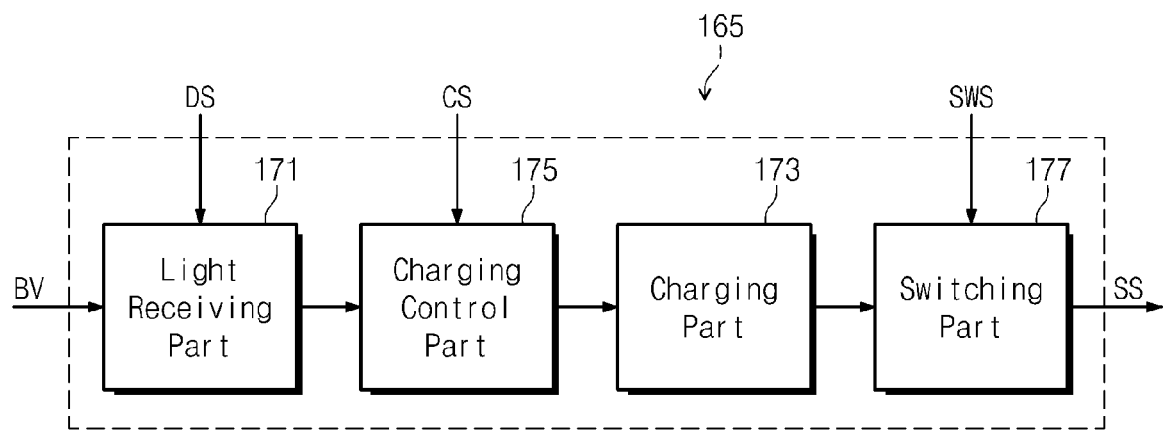
FIG. 4 is a block diagram illustrating an exemplary embodiment of a sensor of the sensor array of FIG. 3.
Figure 5:
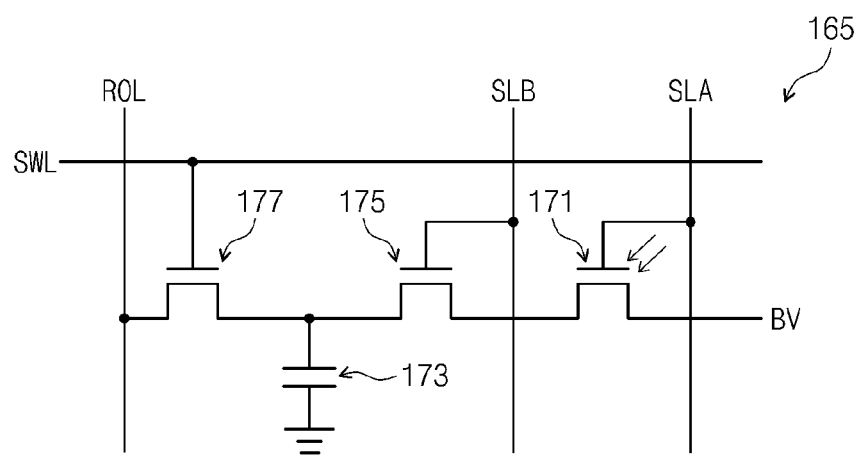
FIG. 5 is a schematic circuit diagram of the sensor of FIG. 4.

FIG. 4 is a block diagram illustrating an exemplary embodiment of a sensor 165 of FIG. 3, and FIG. 5 is a schematic circuit diagram of the sensor 165 of FIG. 4.

As shown in FIGS. 4 and 5, the sensor 165 includes a light receiving part 171 that outputs the sensing signal SS corresponding to the external light in response to the driving signal DS, a charging part 173 connected to the light receiving part 171 and which charges the sensing signal SS, a charging control part 175 connected between the light receiving part 171 and the charging part 173 and which controls charging of the charging part 173 in response to the control signal CS, and a switching part 177 connected to the charging part 173 and which reads out the sensing signal SS charged in the charging part in response to the switching signal SWS.

The light receiving part 171 includes a photo thin film transistor including a first terminal that receives a bias voltage BV, a second terminal connected to the first signal line SLA and which receives the driving signal DS, and a third terminal that outputs the sensing signal SS. The second terminal of the light receiving part 171 controls a current flow between the first terminal and the third terminal of the light receiving part 171 in response to the driving signal DS. The bias voltage BV applied to the first terminal may be a DC voltage.

A photo-current path is generated in the light receiving part 171 in response to the external light. In an exemplary embodiment, when the bias voltage BV and the driving signal DS are respectively applied to the first terminal and the second terminal of the light receiving part 171 and an active layer (not shown) senses the external light, the photo-current path corresponding to an amount of a sensed light sensed by the active layer runs from the first terminal to the third terminal via a channel between the first and third terminal. Accordingly, the light receiving part 171 outputs the sensing signal SS corresponding to the amount of the sensed light in response to the bias voltage BV, and thereby senses various information such as documents, images, touch inputs, for example.

The charging part 173 is connected to the light receiving part 171 via the charging part 175 and thereby stores electric charges corresponding to the sensing signal SS.

The charging control part 175 includes a thin film transistor including a first terminal connected to the light receiving part 171, a second terminal connected to the second signal line SLB and which receives the control signal CS, and a third terminal connected to the charging part 173. The second terminal of the charging control part 175 controls a current flow between the first and the third terminals of the charging control part 175 in response to the control signal CS. The charging control part 175 may control the charging time of the charging part 173 corresponding to a first time period, e.g., a turn-on time period of the control signal CS.

The switching part 177 includes a thin film transistor including a first terminal connected to the charging part 173, a second terminal connected to the switching line SWL and which receives the switching signal SWS, and a third terminal connected to the read-out line ROL. The second terminal of the switching part 177 controls a current flow between the first and the third terminals of the switching part 177 in response to the switching signal SWS. The switching part 177 outputs the sensing signal SS charged in the charging part 173 to the read-out line ROL during the first time period, e.g., a turn-on time period of the switching signal SWS.

In the sensor 165, the charging control part 175 controls the charging time of the charging part 173. In an exemplary embodiment, the charging part 173 of each sensor is charged by the sensing signal SS during a same charging time. Therefore, the sensors 165 disposed in a matrix form, e.g., a matrix pattern, may be simultaneously charged by the sensing signal SS during a predetermined time period, e.g., the first time period, and thus the sensing circuit may sense the image substantially accurately, e.g., without distortion.

Figure 6:
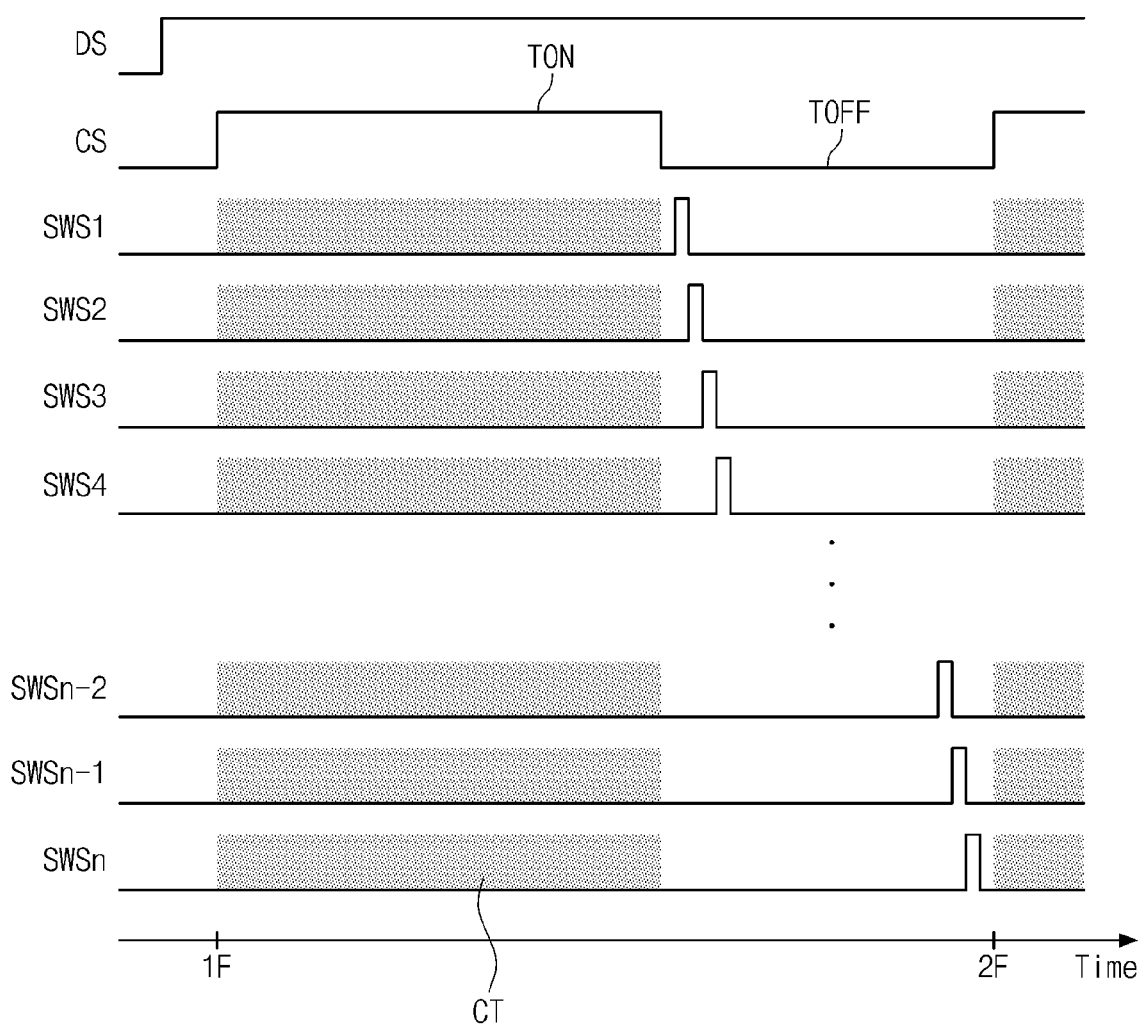
FIG. 6 is a signal timing diagram illustrating waveforms of a driving signal, a control signal and switching signals of the sensing circuit of FIG. 2.

FIG. 6 is a signal timing diagram illustrating an exemplary embodiment of waveforms of a driving signal, a control signal and switching signals of the sensing circuit 150 of FIG. 2.

As shown in FIG. 6, the sensing circuit 150 outputs sensing signals charged in the sensors 165 in a predetermined order, e.g., successively from first row sensors to n-th row sensors of the sensors 165 disposed on a first row to the n-th row of the sensor array, respectively, in response to the external light during the frame time period, e.g., from a first frame starting point 1F to a second frame starting point 2F.

The first controller 170 provides the driving signal DS including a turn-on time period corresponding to the frame time period to the light receiving part 171. In an exemplary embodiment, the first controller 170 provides the driving signal DS, e.g., a direct-current voltage, to light receiving parts 171 of the sensors 165 disposed on the first row to the n-th row of the sensor array when the sensors 165 disposed on the first row to the n-th row operate.

The third controller 180 provides the control signal CS to charging control parts 175 of the sensors 165 during the frame time period. The control signal CS includes a turn-on time period TON in which the sensors 165 disposed on the first column to the n-th column of the sensor array are charged by sensing signals and a turn-off time period TOFF in which the sensors 165 disposed on the first column to the n-th column of the sensor array are not charged by the sensing signals.

In an exemplary embodiment, the sensors 165 disposed on the first row to the n-th row are charged by the sensing signals during a same charging time CT corresponding to the turn-on time period TON of the control signal CS. The sensors 165 disposed on the first row to the n-th row are not charged by the sensing signals during the turn-off time period TOFF of the control signal CS.

The second controller 190 provides switching signals including a first switching signal SWS1 to a n-th switching signal SWSn, in a predetermined order, e.g., successively from the first switching signal SWS1 to the n-th switching signal SWSn to corresponding switching parts 177 of the sensors 165 disposed on the first row to the n-th row, respectively. The switching parts 177 of the sensors 165 disposed on the first row to the n-th row outputs the sensing signals charged during the turn-on time period in response to the switching signals in the predetermined order, e.g., successively from the switching parts of the sensors disposed on the first row to the switching parts of the sensors disposed on the n-th row. In an exemplary embodiment, when the first switching signal SWS1 is applied to the sensors disposed on the first row, sensing signals of the sensors disposed on the first row are discharged. When the second switching signal SWS2 to the n-th switching signal SWSn are applied to the sensors 165 disposed on the second row to the n-th row in the predetermined order, e.g., successively from the sensors disposed on the second row to the sensors disposed on the n-th row, the sensing signals charged in the sensors 165 disposed on the second row to the n-th row are discharged in the predetermined order, e.g., successively from the sensors disposed on the second row to the sensors disposed on the n-th row.

In an exemplary embodiment, the sensors disposed on the first row to the n-th row are substantially charged by the sensing signals during a predetermined time period and simultaneously are not charged by the sensing signal. Thus, the sensors disposed in the matrix form of the sensing circuit sense an image substantially accurately, e.g., without distortion.

Figure 7:
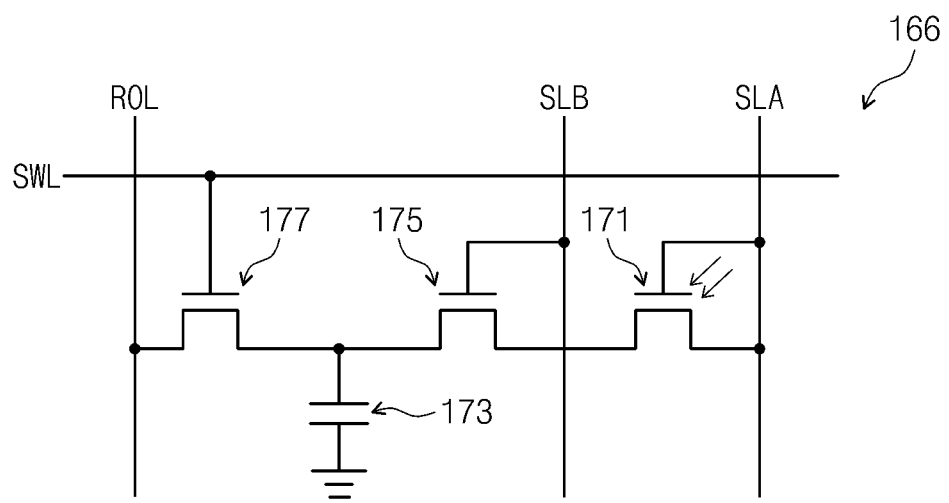
FIG. 7 is a schematic circuit diagram illustrating another exemplary embodiment of a sensor according to the present invention.

FIG. 7 is a schematic circuit diagram illustrating another exemplary embodiment of a sensor. The same or like elements shown in FIG. 5 have been labeled with the same reference characters as used above to describe the exemplary embodiments of the sensor shown in FIG. 7, and any repetitive detailed description thereof will hereinafter be omitted or simplified.

As shown in FIG. 7, a sensor 166 includes a light receiving part 171, a charging part 173, a charging control part 175 and a switching part 177.

The light receiving part 171 outputs a sensing signal SS corresponding to an external light in response to the external light and a driving signal DS. The light receiving part 171 includes a diode including a first terminal and a second terminal, which are connected to a first signal line SLA and receive the driving signal DS, and a third terminal which outputs the sensing signal SS. The light receiving part 171 may include a PIN diode. The driving signal DS, which in an exemplary embodiment is a direct current voltage, is applied to the first terminal of the light receiving part 171 and serves as a bias voltage, and applied to the second terminal to flow a current from the first terminal to the third terminal of the light receiving part 171.

According to the exemplary embodiments of the present invention as described herein, the charging control parts 175 of the sensors control the charging time of the charging parts 173 of the sensors, and each of the charging parts 173 of the sensors is charged by a sensing signal during a same charging time. Thus, the sensors 165 disposed in the matrix form are simultaneously charged by sensing signals during a predetermined time period, and the sensing circuit senses the image substantially accurately, e.g., without distortion.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A sensing circuit comprising:
   a sensor array having a plurality of sensors are simultaneously charged by a sensing signal corresponding to an external light in response to a driving signal during a first time period and discharged in response to respective switching signals during a second time period after the first time period in response to a control signal;
   a first controller which provides the driving signal to the sensor array; and
   a second controller which provides the switching signals to the sensor array,
   wherein each of the sensors comprises,
   a light receiving part which outputs the sensing signal corresponding to the external light in response to the driving signal received during a frame time period which includes the first time period and the second time period;
   a charging part which charges the sensing signal;
   a charging control part connecting between the light receiving part and the charging part and which is turned on during the first time period and turned off during the second time period in response to the control signal; and
   a switching part connected to the charging part and which reads out the sensing signal charged at the charging part during the second time period of the frame time period.

2. The sensing circuit of claim 1, further comprising a third controller which provides the control signal to the charging control part.

3. The sensing circuit of claim 1, wherein the plurality of sensors are arranged in a matrix form.

4. The sensing circuit of claim 1, further comprising: a first signal line connected to the first controller and which provides a respective switching signal of the driving signal to the light receiving part; a switching line connected to the second controller and which provides a respective switching signal to the charging control part.

5. The sensing circuit of claim 1, wherein the light receiving part comprises at least one of a photo thin film transistor and a PIN diode.

6. The sensing circuit of claim 1, wherein the driving signal provided to the light receiving part from the first controller is a direct-current voltage.

7. A display apparatus comprising:
   a display panel which receives a light and displays an image; and
   a sensing circuit which detects an external light from an external source and provides a sensing signal corresponding to the external light to the display panel,
   wherein the sensing circuit comprises:
   a sensor array having a plurality of sensors are simultaneously charged by the sensing signal in response to a driving signal during a first time period and discharged in response to respective switching signals during a second time period after the first time period;
   a first controller which provides the driving signal to the sensor array; and
   a second controller which provides the switching signals to the sensor array,
   wherein each of the sensors comprises,
   a light receiving part which outputs the sensing signal corresponding to the external light in response to the driving signal received during a frame time period which includes the first time period and the second time period;
   a charging part which charges the sensing signal;
   a charging control part connecting between the light receiving part and the charging part and which is turned on during the first time period and turned off during the second time period in response to the control signal; and
   a switching part connected to the charging part and which reads out the sensing signal charged at the charging part during the second time period of the frame time period.

8. The display apparatus of claim 7, further comprising a third controller which provides the control signal to the sensor array corresponding to the charging control part.

9. The display apparatus of claim 7, wherein the plurality of sensors are arranged in a matrix form.

10. The display apparatus of claim 7, further comprising:
    a first signal line connected to the first controller and which provides the driving signal to the light receiving part; a switching line connected to the second controller and which provides a respective switching signal of the switching signals to the switching part; and a second signal line connected to the third controller and which provides the control signal to the charging control part.

11. The display apparatus of claim 7, wherein the light receiving part comprises at least one of a photo thin film transistor and a PIN diode.

12. The display apparatus of claim 7, wherein the driving signal provided to the light receiving part from the first controller is a direct-current voltage.

13. The display apparatus of claim 8, wherein the display panel comprises:
- a first substrate including a first base substrate, thin film transistors disposed on the first base substrate and pixel electrodes connected to the thin film transistors;
- a second substrate disposed opposite the first substrate and including a second base substrate, a color filter disposed on the second base substrate and a common electrode disposed on the second base substrate; and
- a liquid crystal layer interposed between the first substrate and the second substrate and which controls an amount of a light transmission through the display panel,
- wherein the common electrode and the pixel electrode generate an electric field therebetween.

14. The display apparatus of claim 13, further comprising a backlight unit which provides the light to the display panel.

\* \* \* \* \*